US010058012B2

(12) United States Patent
Curtin et al.

(10) Patent No.: US 10,058,012 B2
(45) Date of Patent: Aug. 21, 2018

(54) MULTIZONE VARIABLE DAMPER FOR USE IN AN AIR PASSAGEWAY

(75) Inventors: Daniel J. Curtin, Alexandria, VA (US); William W. Reynolds, Pasadena, MD (US); Daniel B. Kennedy, Lovettsville, VA (US)

(73) Assignee: TATE ACCESS FLOORING LEASING, INC., Wilmington, DE (US)

( * ) Notice: Subject to any disclaimer, the term of this patent is extended or adjusted under 35 U.S.C. 154(b) by 1309 days.

(21) Appl. No.: 12/971,525

(22) Filed: Dec. 17, 2010

(65) Prior Publication Data
US 2012/0156981 A1 Jun. 21, 2012

(51) Int. Cl.
*F24F 13/06* (2006.01)
*H05K 7/20* (2006.01)

(52) U.S. Cl.
CPC ..... *H05K 7/20745* (2013.01); *H05K 7/20618* (2013.01); *H05K 7/20836* (2013.01); *F24F 2221/40* (2013.01)

(58) Field of Classification Search
CPC ........................................................ F24F 13/06
USPC ................................................. 454/184, 187
See application file for complete search history.

(56) References Cited

U.S. PATENT DOCUMENTS

| 628,459 A | 7/1899 | Goll |
| 1,265,055 A | 5/1918 | Clover |
| 2,811,093 A | 10/1957 | Lathrop |
| 3,035,504 A | 5/1962 | Cline et al. |
| 3,303,771 A * | 2/1967 | Nesher .................. E04B 9/0478 454/187 |
| 3,721,067 A | 3/1973 | Agnew |
| 3,727,537 A | 4/1973 | Harty, Jr. |
| 4,729,292 A * | 3/1988 | Marton ................. F24F 13/075 454/284 |
| 5,192,348 A | 3/1993 | Ludwig |
| 5,324,229 A | 6/1994 | Weisbecker |
| 5,402,617 A * | 4/1995 | Daw ................. E04F 15/02405 52/220.5 |

(Continued)

FOREIGN PATENT DOCUMENTS

| EP | 0 372 784 A2 | 6/1990 |
| GB | 2 174 193 A | 10/1986 |

(Continued)

OTHER PUBLICATIONS

Dec. 2, 2011 International Search Report issued in International Application No. PCT/US2011/051920.

(Continued)

*Primary Examiner* — Steven B McAllister
*Assistant Examiner* — Samantha Miller
(74) *Attorney, Agent, or Firm* — Oliff PLC

(57) ABSTRACT

A multizone variable damper for air passageways having a plurality of damper zones, a plurality of opposed blades that are rotatable about a horizontal axis, a pair of blades of the plurality of blades being provided in each zone of the plurality of damper zones, and an actuator for each pair of blades, each actuator being configured to independently rotate each of the pairs of blades of the plurality of opposed blades so as to selectively and independently control a degree of openness of each of the pairs of blades of the plurality of opposed blades in each damper zone of the plurality of damper zones.

20 Claims, 5 Drawing Sheets

(56) References Cited

U.S. PATENT DOCUMENTS

| | | | |
|---|---|---|---|
| 5,454,756 A | 10/1995 | Ludwig | |
| 5,468,186 A | 11/1995 | Bolton et al. | |
| 5,505,379 A | 4/1996 | Wagner | |
| 5,697,841 A | 12/1997 | Di Giovine | |
| 5,851,143 A | 12/1998 | Hamid | |
| 5,863,246 A | 1/1999 | Bujak, Jr. | |
| 5,876,281 A * | 3/1999 | Hirasawa | F24F 3/161 454/187 |
| 6,019,677 A * | 2/2000 | Demster | F24F 7/10 454/289 |
| 6,101,768 A | 8/2000 | Springstead et al. | |
| 6,256,952 B1* | 7/2001 | Fahy, Jr. | E04B 9/02 52/126.6 |
| 6,374,627 B1 | 4/2002 | Schumacher et al. | |
| 6,474,559 B2 | 11/2002 | Park | |
| 6,574,104 B2 | 6/2003 | Patel et al. | |
| 6,628,520 B2* | 9/2003 | Patel et al. | 361/696 |
| 6,694,759 B1 | 2/2004 | Bash et al. | |
| 6,747,872 B1* | 6/2004 | Patel et al. | 361/695 |
| 6,834,512 B2* | 12/2004 | Bash et al. | 62/180 |
| 7,031,154 B2 | 4/2006 | Bash et al. | |
| 7,057,506 B2 | 6/2006 | Bash et al. | |
| 7,214,131 B2 | 5/2007 | Malone | |
| 7,232,369 B2 | 6/2007 | Karidis et al. | |
| 7,286,351 B2* | 10/2007 | Campbell et al. | 361/696 |
| 7,313,924 B2 | 1/2008 | Bash et al. | |
| 7,341,201 B2* | 3/2008 | Stanimirovic | 236/49.1 |
| 7,347,058 B2 | 3/2008 | Malone et al. | |
| D567,398 S * | 4/2008 | Meyer | D25/156 |
| 7,568,360 B1* | 8/2009 | Bash et al. | 62/186 |
| 7,596,476 B2* | 9/2009 | Rasmussen et al. | 703/2 |
| 7,597,617 B2 | 10/2009 | Solberg et al. | |
| 7,630,795 B2* | 12/2009 | Campbell et al. | 700/300 |
| 7,895,855 B2* | 3/2011 | Gooch | 62/259.2 |
| 7,907,402 B2* | 3/2011 | Caveney | H05K 7/20572 312/223.2 |
| 7,966,837 B2* | 6/2011 | El-Galley et al. | 62/186 |
| 8,300,410 B2* | 10/2012 | Slessman | 361/691 |
| 8,382,443 B2* | 2/2013 | Nakano et al. | 417/42 |
| 2004/0218355 A1* | 11/2004 | Bash et al. | 361/690 |
| 2005/0159099 A1 | 7/2005 | Malone | |
| 2005/0193761 A1* | 9/2005 | Vogel et al. | 62/407 |
| 2005/0237716 A1* | 10/2005 | Chu et al. | 361/696 |
| 2005/0279843 A1* | 12/2005 | Dieksander et al. | 236/49.3 |
| 2006/0048525 A1* | 3/2006 | Cook | 62/131 |
| 2007/0125107 A1 | 6/2007 | Beam | |
| 2007/0173189 A1* | 7/2007 | Lewis | H05K 7/20009 454/184 |
| 2007/0213000 A1* | 9/2007 | Day | 454/184 |
| 2008/0055848 A1 | 3/2008 | Hamburgen et al. | |
| 2009/0097203 A1 | 4/2009 | Byers et al. | |
| 2009/0168345 A1* | 7/2009 | Martini | 361/691 |
| 2009/0293518 A1 | 12/2009 | Bettella | |
| 2010/0041327 A1* | 2/2010 | Desler | 454/184 |
| 2010/0057258 A1 | 3/2010 | Clanin | |
| 2010/0085707 A1 | 4/2010 | Moss | |
| 2010/0139908 A1 | 6/2010 | Slessman | |
| 2011/0106314 A1* | 5/2011 | Beitelmal et al. | 700/276 |
| 2012/0009862 A1* | 1/2012 | Meyer | 454/184 |
| 2012/0060429 A1* | 3/2012 | Reynolds et al. | 52/19 |
| 2014/0138047 A1* | 5/2014 | Phelps et al. | 165/57 |

FOREIGN PATENT DOCUMENTS

| | | |
|---|---|---|
| WO | WO 2005/091099 A2 | 9/2005 |
| WO | WO 2005/115080 A2 | 12/2005 |
| WO | WO 2010/004082 A1 | 1/2010 |

OTHER PUBLICATIONS

Dec. 2, 2011 Written Opinion of the International Searching Authority issued in International Application No. PCT/US2011/051920.

Boucher et al., "Viability of Dynamic Cooling Control in a Data Center Environment," Journal of Electronic Packaging, Jun. 2006, U.S.A., pp. 137-144.

Michael Schwarz, "Fan Energy Reduction in an Existing Data Center—A Case Study", Newslink, Fall 2007, U.S.A.

* cited by examiner

MULTIZONE VARIABLE DAMPER FOR USE IN AN AIR PASSAGEWAY

BACKGROUND

1. Field of the Invention

This invention relates to variable dampers that regulate air flow through passageways, such as grates. The dampers are positioned in or adjacent the passageways and have one or more members that selectively and variably block air passing through the passageways.

2. Background of the Invention

There are certain environments in which it may be desirable to regulate the air flow through a passageway such that different volumes of air are permitted to pass through different zones of the passageway. One such environment is a data center, and the subject passageway is an access floor grate panel in the data center, as discussed below.

A typical data center includes multiple IT racks. The equipment supported by those racks, and the associated cables and other accessories, generate a relatively high amount of heat. Because of that heat, providing adequate cooling to IT racks in the data center is of paramount importance. Moreover, it is desirable that the IT racks be cooled as efficiently as possible, as the energy costs to cool IT racks may approach a large percentage of the energy costs to operate the data center.

Data centers typically have a raised floor system, often called an access floor system. An access floor system is usually comprised of a continuous array of floor panels, arranged edge-to-edge, and supported above the sub-floor by support structure. The array of access floor panels usually extends wall-to-wall in the data centers.

A plenum is formed between the sub-floor and the access floor panel array. Cables, wires, hoses, etc. are located in the plenum, and the plenum is also used as a conduit for cooling air. Often, one or more air conditioning units supply air to the plenum, and some of the access floor panels in the access floor panel array have grates. The cooling air passes through the grates into the data center.

The access floor panels with grates are usually positioned immediately adjacent to IT racks, and may have vanes that direct the cooling air that passes through the grates toward the IT racks.

A typical IT rack supports a variety of electronic equipment. The equipment is often unevenly distributed throughout the rack, including vertically. In that regard, an IT rack may have shelves, spaced vertically. Different equipment may be placed on the different individual shelves.

Different IT equipment generates different amounts of heat. Thus, the heat generated by the equipment at one vertical height of an IT rack (e.g., on one shelf) may differ from the heat generated by the equipment at another vertical height of the same IT rack (e.g., on a different shelf). However, the prior art IT rack cooling apparatus does not take into account that difference in heat at the various heights. Rather, usually there are temperature sensors at various locations of an IT rack, and the volume of cooling air is determined for the whole rack based on the readings of those sensors. In fact, often the volume of cooling air for the entire rack is based on the highest sensed temperature in the IT rack. That is, the entire IT rack is subjected to the volume of cooling air necessary to cool the hottest area or zone in the rack, even the areas or zones of the rack that are already much cooler than the hottest area or zone.

This results in inefficient cooling of the IT racks, because the cooling air is directed at the same volume to all areas of the IT rack based on the highest temperature in the rack, even to those areas that may need little, if any, cooling. More efficient and economical cooling would be achieved if larger amounts of cooling air are directed to the hottest areas of the IT racks, while lesser amounts of cooling air are directed to the other, cooler areas of the IT rack. Thus, in a data center, there is a need for cooling apparatus that directs different amounts of cooling air to different areas of or zones in the IT racks in the data center.

SUMMARY OF THE INVENTION

The multizone variable damper of this invention addresses that need, as well as the need in other environments for apparatus that selectively regulates the flow of air in different zones of a passageway.

A multizone variable damper according to one embodiment of this invention includes two or more air passageway zones defined by movable members, wherein the positions of the movable members determine the air passageway openings in each of the passageway zones. The movable members are movable relative to each other such that the sizes of the air passageway openings in the passageway zones can be varied relative to each other. This embodiment also includes actuators that move the movable members relative to each other.

In certain embodiments, the movable members are pairs of opposed blades, with one of the pairs of opposed blades being located in each air passageway zone. The blades may extend lengthwise, and the air passageway zones may be aligned edge-to-edge widthwise.

The actuators can be manual or "automatic." The "automatic" actuators may move the movable blades based on predetermined conditions (e.g., time of day) or sensed conditions (e.g., temperature or pressure differential).

DETAILED DESCRIPTION

Before describing the multizone variable damper of this invention, one environment in which it may be utilized is first described. The environment is a data center that includes one or more IT racks. That environment is illustrated, in part, in FIG. 1.

Figure 1:
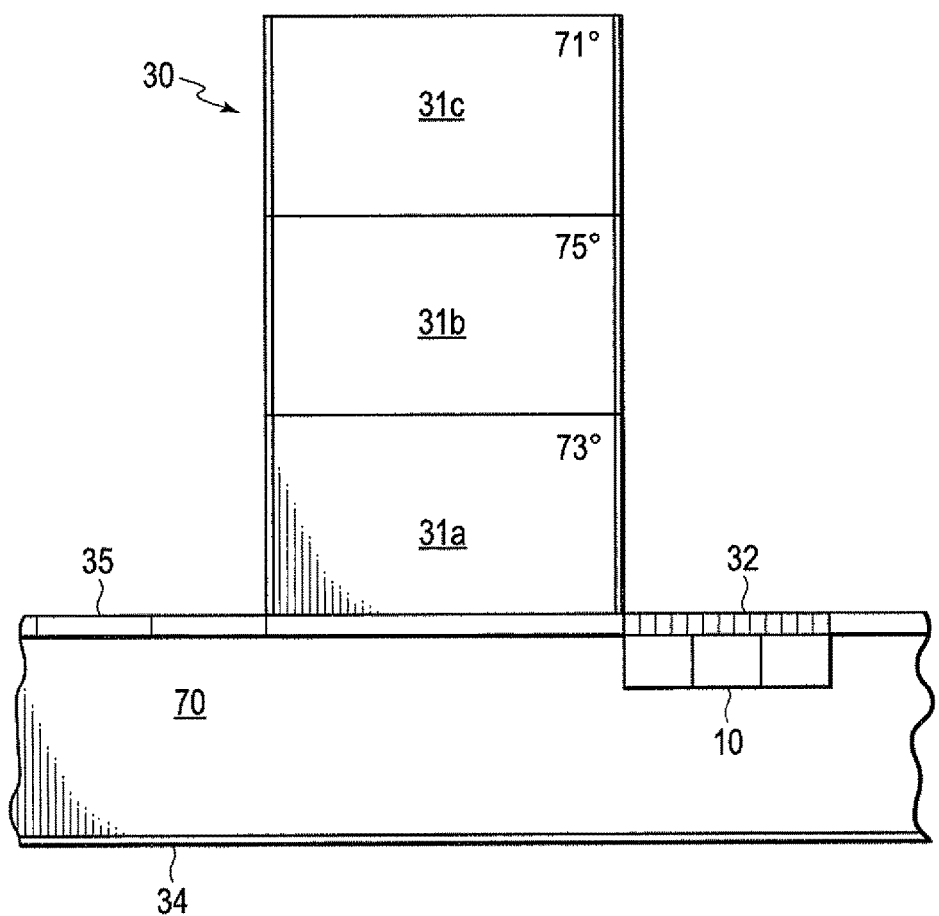
FIG. 1 is a partial view of a data center that includes a multizone variable damper of this invention.

In FIG. 1, IT rack 30 is in a data room and positioned on and supported by access floor panel array 35. Access floor array 35 is spaced above subfloor 34. The space or plenum 70 between access floor panel array 35 and subfloor 34 functions as a conduit for air from an air conditioning unit (not shown). The access floor panel array 35 includes grate panel 32, which is positioned immediately adjacent IT rack 30. An access floor panel array in a data room will usually include multiple grate panels. FIG. 1 illustrates one of those grate panels. Cooling air passes from plenum 70 through grate panel 32 to cool IT rack 30.

IT rack 30 supports a variety of IT equipment. The heat generated by the equipment supported by IT rack 30 may vary in different areas or zones of IT rack 30 for many reasons, including the following. First, different types of IT equipment generate different amounts of heat. Second, the equipment may be unevenly distributed in IT rack 30, in all three dimensions, including vertically, laterally and longitudinally. Third, different units or assemblies of the equipment may operate at different times of the day. All of those factors may result in zones of different temperatures in IT rack 30 at any given time. For example, in FIG. 1, IT rack 30 may have vertical zones 31a, 31b and 31c, from bottom to top, of different temperatures at a given time. In FIG. 1, those temperatures are: zone 31a—73°; zone 31b—75°; and zone 31c—71°.

To achieve the most efficient and economical cooling of IT rack 30 when it has zones of different temperatures, such as zones 31a, 31b and 31c, it is desirable to supply or direct different volumes of cooling air to the different zones, so that each zone is cooled by the minimum necessary amount of cooling air. Thus, taking FIG. 1 as an example, for efficient and economical cooling, more cooling air should be directed to zone 31b than to zones 31a and 31c, and more cooling air should be directed to zone 31a than to zone 31c.

This invention achieves that goal, as discussed in detail below.

The embodiment of this invention illustrated in the Figures is multizone variable damper 10. In FIG. 1, multizone variable damper 10 is positioned below grate panel 32 in access floor panel array 35.

Figure 2:
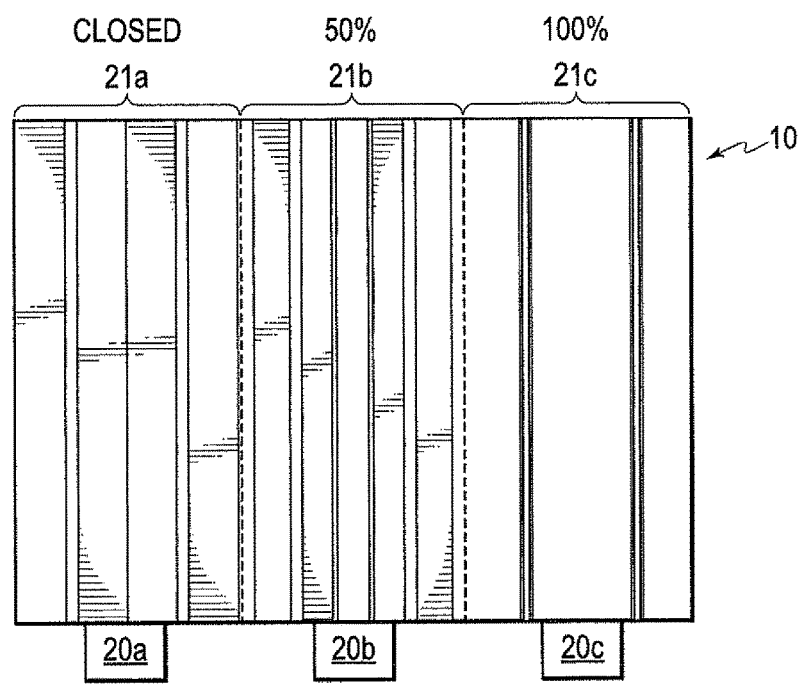
FIG. 2 is a top view of one embodiment of this invention.
Figure 3:
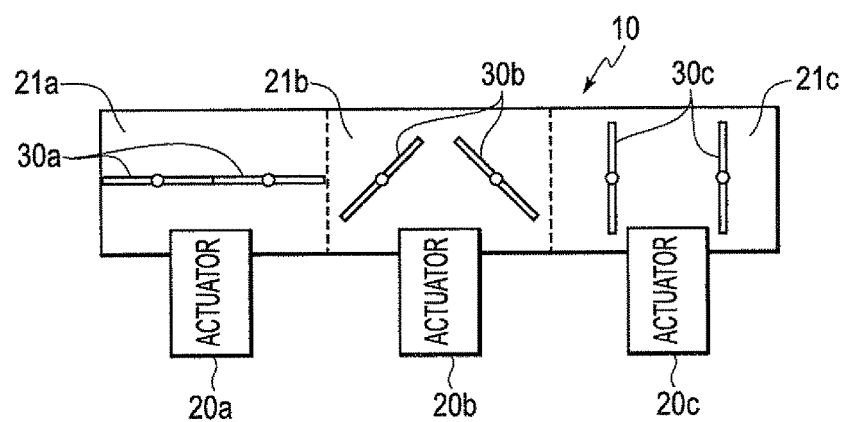
FIG. 3 is a side view of the embodiment of this invention illustrated in FIG. 2.

Multizone variable damper 10 is illustrated in more detail in FIGS. 2 and 3. In particular, FIG. 2 is a top view and FIG. 3 is a side view of multizone variable damper 10.

In the embodiment illustrated in the Figures, the multizone variable damper 10 defines three zones: zones 21a, 21b and 21c. The number of zones is not limited to three, but can be more than three zones and as few as two zones.

The zones 21a, 21b and 21e are positioned such that air that passes through each zone is directed, by grate panel 32, to a specific zone in IT rack 30. In this embodiment, the air from zone 21a is directed to IT rack zone 31a, the air from zone 21b is directed to IT rack zone 31b, and the air from zone 21c is directed to IT rack zone 31c. See FIGS. 6 and 7, discussed in more detail below.

Also in the embodiment illustrated in the Figures, each zone has a pair of opposed blades that move relative to each other to control airflow through that zone. Specifically, opposed blades 30a are in zone 21a, opposed blades 30b are in zone 21b and opposed blades 30c are in zone 21c. The blades 30a, 30b and 30c can be made of any material that is capable of providing the structural rigidity required for a given application. Preferably, the blades 30a, 30b and 30c are made of metal.

Opposed blades 30a, 30b and 30c extend the length of multizone variable damper 10, and the zones 21a, 21b and 21e are located serially along the width of multizone variable damper 10.

As shown in FIG. 3, in this embodiment of the invention, each blade of blades 30a, 30b and 30c is rotatable about an axis. The blades are rotatable between the extreme positions of completely closed (see blades 30a in FIG. 3) to completely open (see blades 30c in FIG. 3) to all positions between those extreme positions.

While the embodiment illustrated in the Figures utilizes pairs of opposed blades 30a, 30b and 30c to regulate the amount of air that passes through each zone 21a, 21b and 21c, respectively, any other means for variably regulating air flow through zones 21a, 21b and 21c can be used in place of opposed blades 30a, 30b and 30c, including single blades. However, one advantage of using a pair of opposed blades instead of a single blade is that the pair of opposed blades does not interfere with the directional nature of grate panel 32 if grate panel 32 is a directional grate.

In this embodiment, the multizone variable damper 10 includes actuators 20a, 20b and 20c, which are provided for each pair of opposed blades 30a, 30b, and 30c, respectively. The actuators 20a, 20b and 20c rotate the pairs of opposed blades 30a, 30b and 30c to their desired positions. The actuators 20a, 20b and 20c can either be manually operated or can be automatically operated.

There is a wide variety of manual actuators that can be used to rotate the blades of pairs of opposed blades 30a, 30b and 30c, including a lever (not shown) that is rotatable between fully closed and fully opened positions, and all positions between those two extremes. The lever is connected by a link or a series of links to a member that rotates the pair of blades. When the lever is in a first position, the rotatable member positions the pair of blades in the completely closed position. When the lever is rotated to a second position, the rotatable member is rotated to position the pair of blades in the completely open position.

There is also a wide variety of "automatic" actuators that can be used to rotate the blades of pairs of opposed blades 30a, 30b and 30c, including motors that rotate the blades in accordance with signals or instructions from a control unit. The control unit may instruct the movement of the blades based on a sensed condition, or a predetermined condition such as by the time. An example of a control unit that is responsive to a sensed condition is illustrated in FIG. 5.

Figure 5:
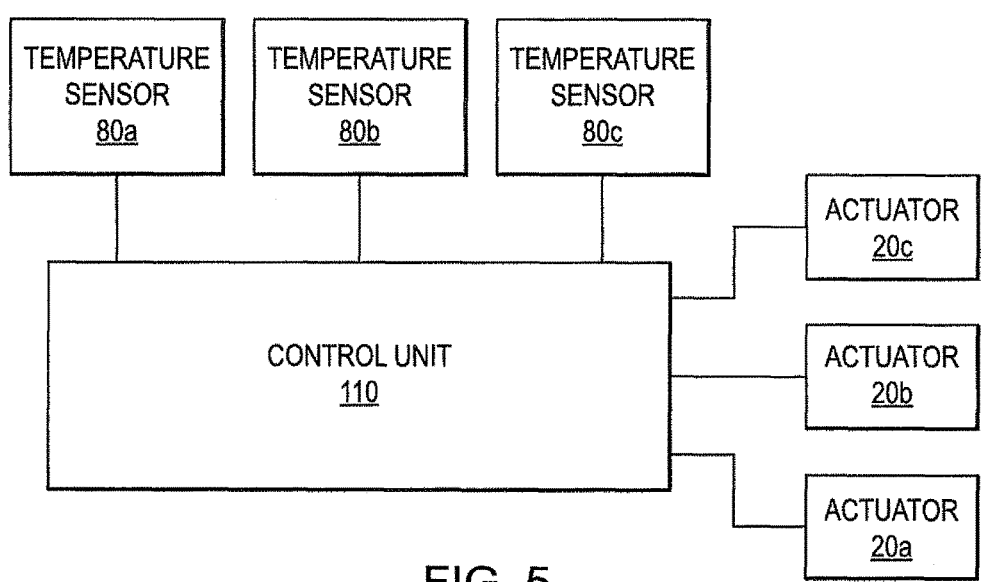
FIG. 5 is a schematic diagram of the sensors, control unit and actuators.

In FIG. 5, the temperatures from sensors 80a, 80b and 80c are communicated to control unit 110. Based on that temperature data, control unit 110 instructs the actuators 20a, 20b and 20c to rotate the various blades of pairs of blades 30a, 30b and 30e as necessary to adjust the openings provided by the pairs of blades 30a, 30b and 30c.

Figure 4:
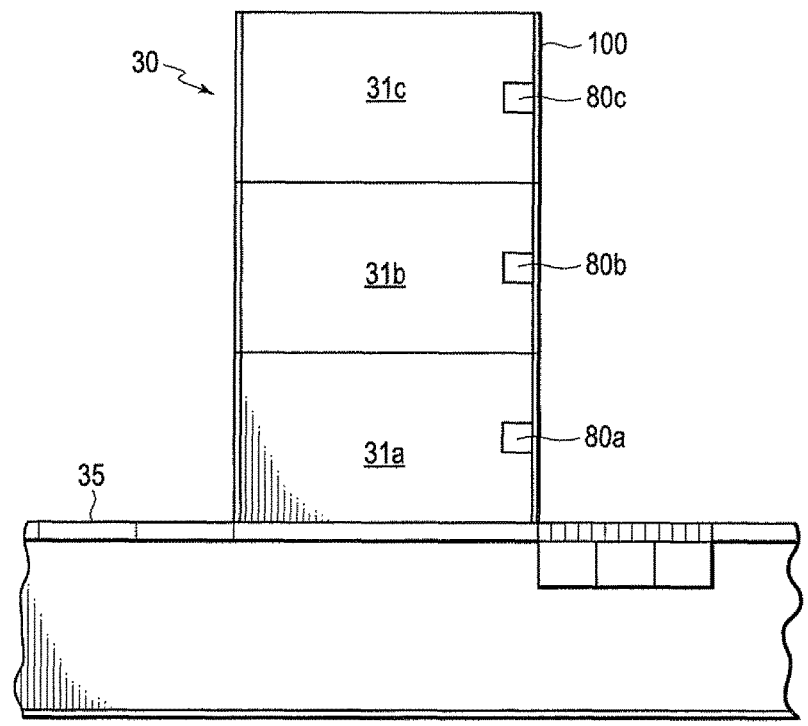
FIG. 4 is a schematic diagram of the multizone variable damper of FIGS. 1-3 installed in an access floor panel array, with temperature sensors on the adjacent IT rack.

In the embodiment illustrated by FIG. 4, the temperature sensors 80a, 80b and 80c are located in IT rack zones 31a, 31b and 31c, respectively. Each sensor 80a, 80b and 80c can be a single sensor unit or multiple sensor units. In the embodiment illustrated in the FIG. 4, the temperature sensors 80a, 80b and 80c are single units located on the front face 100 of the IT rack 30. However, the temperature sensors 80a, 80b and 80c can be placed at other positions in zones 31a, 31b and 31c, for example, on the back face of IT rack 30 where the cooling air is exhausted. Further, if a sensor 80a, 80b and/or 80c includes more than one sensor unit, those sensor units can be positioned in different locations in the respective zones 31a, 31b and 31c.

The temperature data from sensors 80a, 80b and 80c is used to adjust the positions of the blades of pairs of blades 30a, 30b and 30c so that the minimal necessary cooling air is directed or supplied to the IT rack zones 31a, 31b and 31c. Examples are discussed below, with reference to FIGS. 6 and 7.

Figure 6:
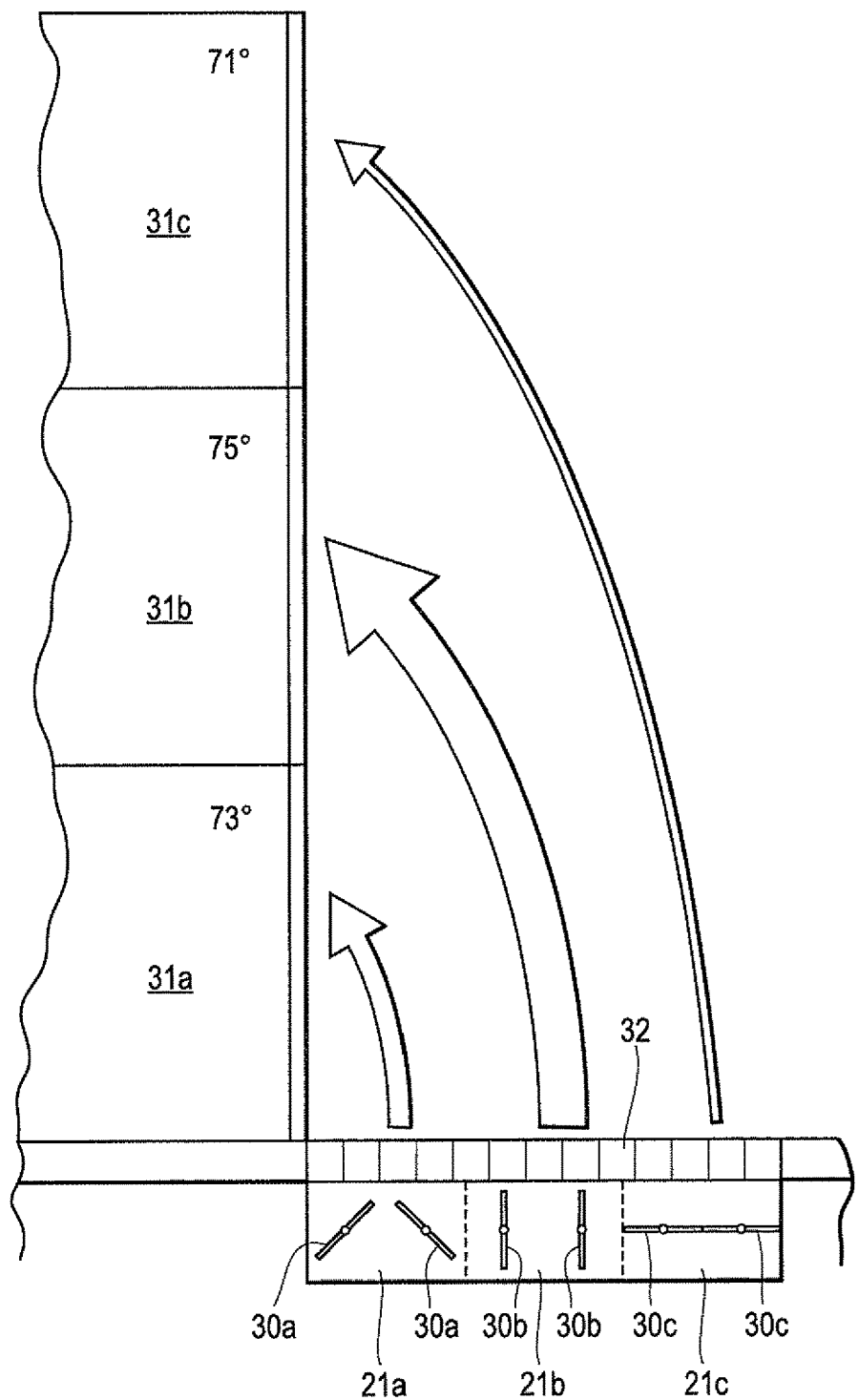
FIGS. 6 and 7 illustrate the multizone variable damper of FIGS. 2 and 3, in a data center, with the pairs of opposing blades in different positions.

In FIG. 6, the temperature in IT rack zone 31a is 73°, the temperature in IT rack zone 31b is 75°, and the temperature in IT rack zone 31c is 71°. Those temperatures are communicated to control unit 110, which instructs actuators 20a, 20b and 20c to place blades 30a, 30b and 30c in the positions illustrated in FIG. 6, which is that blades 30a are in a partially open state, blades 30b are in a fully opened state and blades 30c are in a completely closed state. This results in the highest airflow being directed to IT rack zone 31a, a less amount of airflow being directed to IT rack zone 31b, and little, if any, airflow being directed to IT rack zone 31c.

Figure 7:
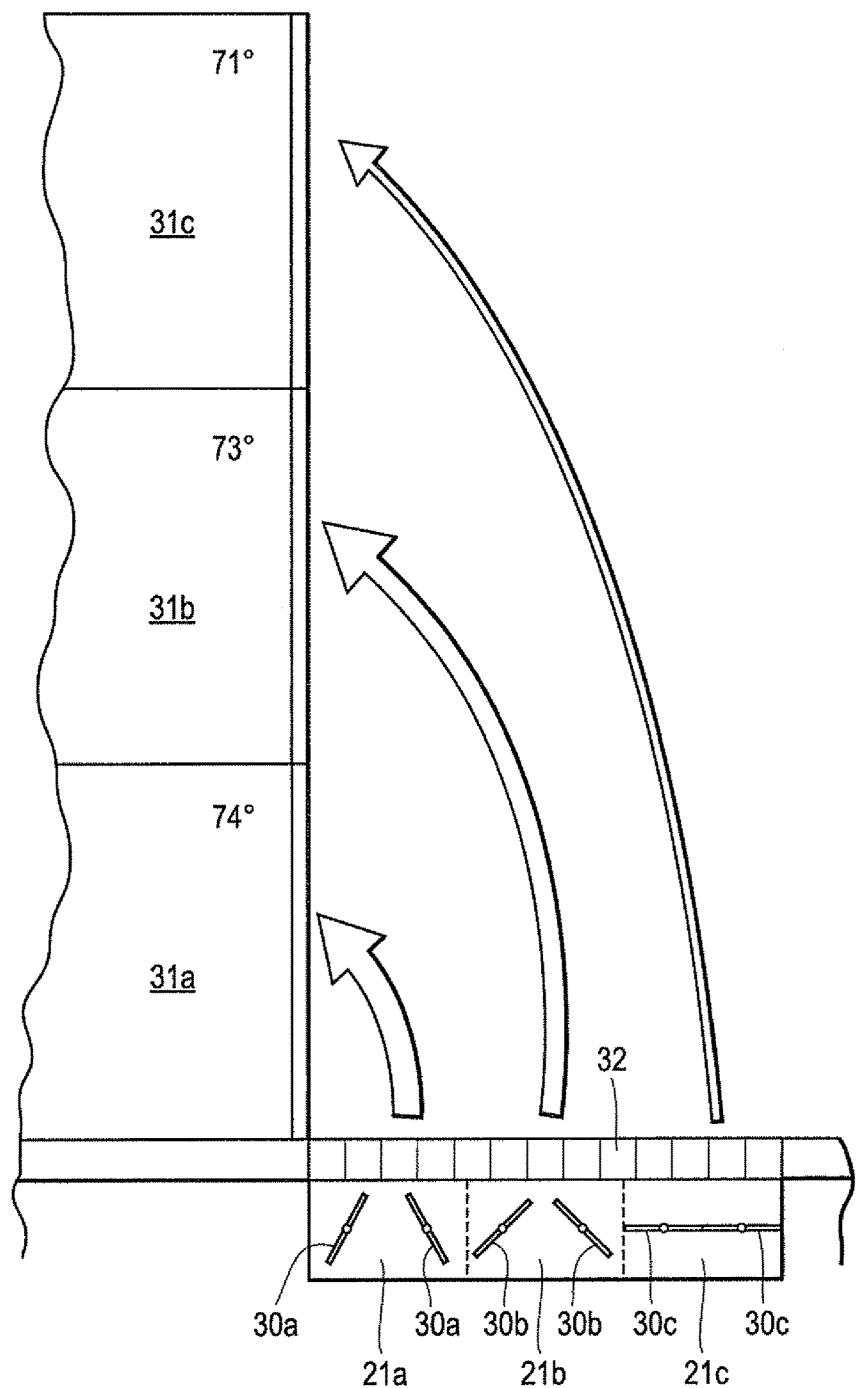

In FIG. 7, the temperature in IT rack zone 31a is 74°, the temperature in IT rack zone 31b is 73°, and the temperature in IT rack zone 31c is 71°. Accordingly, control unit 110 instructs actuators 20a, 20b and 20c to rotate blades 30a and 30b such that blades 30a and 30b are positioned to be partially open; however, the opening through blades 30a is greater than the opening through blades 30b because IT rack zone 30a is warmer than IT zone 31b. Finally, the blades 30c are positioned in the completely closed position.

As can be determined, blades 30a, 30b and 30c can be positioned relative to each other in any manner dictated by the respective temperatures in IT rack zones 31a, 31b and 31c.

As stated, in this embodiment, the control unit 110 controls the actuators 20a, 20b and 20c based on temperatures in the respective IT rack zones, zones 31a, 31b and 31c. In other embodiments, the control unit 110 may receive and act on pressure differentials in the various zones, for example at the back face of the IT rack 30, instead of the temperatures.

Further, in other embodiments, each actuator 20a, 20b and 20c may be operated by a separate control unit dedicated to it. That is, instead of a single control unit 110, there is a separate control unit for each actuator 20a, 20b and 20c. Those individual control units receive information from the corresponding IT rack zones and provide instructions to the corresponding actuators. For example, an individual control unit for actuator 20a would receive the temperature data from sensor 80a and instruct actuator 20a accordingly, the control unit for actuator 20b would receive the temperature data from sensor 80b and instruct actuator 20b accordingly, and the control unit for actuator 20c would receive temperature data from sensor 80c and instruct actuator 20c accordingly.

By providing three or more zones, the multizone variable damper 10 of this invention allows for precise cooling of the IT rack 30 based on sensed conditions along the height of the IT rack 30.

What has been described and illustrated herein are preferred embodiments of the invention along with some variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling system for a vertical IT rack comprising:
    an array of access floor panels positioned edge-to-edge and spaced above a subfloor such that there is an air plenum between the subfloor and the array of access floor panels;
    the vertical IT rack is positioned on the array of access floor panels and has a plurality of vertical zones;
    the array of access floor panels including at least one grate panel positioned adjacent the vertical IT rack, the at least one grate panel having a length and a width, the length being substantially parallel to the vertical IT rack and the width being substantially perpendicular to the vertical IT rack, the at least one grate panel having a set of fixed-angled vanes that extend lengthwise of the at least one grate panel and are spaced along the width of the at least one grate panel; the set of fixed-angled vanes of the at least one grate panel directing air passing through the at least one grate panel such that the air is directed at the vertical IT rack;
    a multizone damper located immediately below the at least one grate panel;
    the multizone damper having multiple air passageway zones, each of the multiple air passageway zones extends the length of the at least one grate panel, the air passageway zones are arranged serially along the width of the at least one grate panel;
    the multizone damper has a movable member in each of the multiple air passageway zones which regulates the air flow volume through the air passageway zone;
    wherein the air passing through each of the multiple air passageway zones is directed to a different one of the plurality of vertical zones by the set of fixed-angled vanes of the at least one grate panel;
    wherein each of the movable members is movable independent of the other movable members, such that the air flow volume directed through the multizone damper and the at least one grate panel can vary among the multiple air passageway zones and among the plurality of vertical zones.

2. A cooling system for a vertical IT rack according to claim 1, further comprising actuators that move the movable members independent of the movable members in other of the air passageway zones.

3. A cooling system for a vertical IT rack according to claim 2, wherein the movable member is a pair of rotatable opposed blades.

4. A cooling system for a vertical IT rack according to claim 3, wherein:
    the pairs of rotatable opposed blades are substantially parallel to the vanes and extend lengthwise in each of the multiple air passageway zones; and
    the multiple air passageway zones are aligned edge-to-edge.

5. A cooling system for a vertical IT rack according to claim 4, wherein the actuators are manual actuators.

6. A cooling system for a vertical IT rack according to claim 4, wherein the actuators are automatic actuators that move the pairs of rotatable opposed blades based on a sensed condition.

7. A cooling system for a vertical IT rack according to claim 1 wherein:
    the vertical IT rack has different vertical zones; and
    the combination of the multiple air passageway zones and the at least one grate panel results in the air passing through each of the multiple air passageway zones being directed at a different one of the different vertical zones of the vertical IT rack.

8. A data center comprising:
    an array of access floor panels positioned edge-to-edge and spaced above a subfloor such that there is an air plenum between the subfloor and the array of access floor panels;
    an air conditioning unit that supplies cooling air to the air plenum;
    spaced, substantially parallel rows of vertical IT racks positioned on the array of access floor panels, each of said parallel rows of vertical IT racks having a plurality of vertical zones;
    the array of access floor panels including at least one grate panel positioned adjacent to at least some of the rows of the vertical IT racks, each of the at least one grate panel having a length and a width, the length being substantially parallel to the adjacent row of vertical IT racks and the width being substantially perpendicular to the adjacent row of vertical IT racks, each of the at least one grate panel having a set of fixed-angled vanes that extend lengthwise of the at least one orate panel and are spaced along the width of the at least one grate panel, the set of fixed-angled vanes of the at least one grate panel directing air passing through the at least one grate panel such that the air is directed at the adjacent row of vertical IT racks;

a multizone damper located immediately below each of the at least one grate panel;

the multizone damper having multiple air passageway zones, each of the multiple air passageway zones extends lengthwise of the at least one grate panel, the air passageway zones are arranged serially along the width of the at least one grate panel;

the multizone damper has a movable member in each of the multiple air passageway zones which regulates the air flow volume through the air passageway zone;

wherein the air passing through each of multiple air passageway zones is directed to a different one of the plurality of vertical zones by the set of fixed-angled vanes of the at least one grate mild;

wherein each of the movable members is movable independent of the other movable members, such that the air flow volume directed through the multizone damper and the at least one grate panel can vary among the air passageway zones and among with plurality of vertical zones.

9. A data center according to claim 8, further comprising actuators that move the movable member independent of the movable members in other of the air passageway zones.

10. A data center according to claim 9, wherein the movable member is a pair of rotatable opposed blades.

11. A data center according to claim 10, wherein:
the pairs of rotatable opposed blades are substantially parallel to the vanes and extend lengthwise in each of the multiple air passageway zones; and
the multiple air passageway zones are aligned edge-to-edge.

12. A data center according to claim 11, wherein the actuators are manual actuators.

13. A data center according to claim 11, wherein the actuators are automatic actuators that move the pairs of rotatable opposed blades based on a sensed condition.

14. A data center according to claim 8 wherein:
each of the vertical IT racks of the spaced, substantially parallel rows of vertical IT racks that is adjacent to one of the at least one grate panel has different vertical zones; and
the combination of the multiple air passageway zones and the adjacent at least one grate panel results in the air passing through each of the multiple air passageway zones being directed at a different one of the different vertical zones.

15. A method of cooling a data center including
an array of access floor panels positioned edge-to-edge and spaced above a subfloor such that there is an air plenum between the subfloor and the array of access floor panels;
an air conditioning unit that supplies cooling air to the air plenum; and
spaced, substantially parallel rows of vertical IT racks positioned on the array of access floor panels, each of said parallel rows of vertical IT racks having a plurality of vertical zones; the method comprising:

providing grate panels in the array of access floor panels that are positioned adjacent to at least some of the rows of the vertical IT racks, each of the grate panels having a length and a width, the length being substantially parallel to the adjacent row of vertical IT racks and the width being substantially perpendicular to the adjacent row of vertical IT racks, each of the grate panels having a set of fixed-angled vanes that extend lengthwise of the grate panel and are spaced along the width of the grate panel, the set of fixed-angled vanes of the grate panel directing air passing through the grate panel such that the air is directed at the adjacent row of vertical IT racks;

providing a multizone damper immediately below at least one of the grate panels, the multizone damper having multiple air passageway zones, each of the multiple air passageway zones extends lengthwise of the at least one of the grate panels, the multiple air passageway zones are arranged serially along the width of the grate panel, the multizone damper having a movable member in each of the multiple air passageway zones which regulates the air flow volume through the air passageway zone, wherein the air passing through each of the multiple air passageway zones is directed to a different one of the plurality of vertical zones by the set of fixed-angled vanes of the grate panel, wherein each of the movable members is movable independent of the other movable members, such that the air flow volume directed through the multizone damper and the at least one of the grate panels can vary among the air passageway zones and among the plurality of vertical zones;

activating the air conditioning unit to supply cooling air to the air plenum; and moving the movable members of the passageway zones of the multizone damper to vary the air flow volume through the multizone damper and the at least one of the grate panels among the air passageway zones.

16. A method of cooling a data center according to claim 15, wherein:
each of the movable members is a pair of opposed blades, each of the opposed blades is rotatable about a horizontal axis, and the pairs of opposed blades are arranged edge to edge along the width of the damper; and further comprising the step of:
independently rotating each of the pairs of opposed blades so as to selectively and independently control a degree of openness of each of the pairs of blades.

17. A method of cooling a data center according to claim 16, further comprising the step of individually controlling the degree of openness of each of the pairs of blades based on sensed conditions at specific locations along a height of the IT racks.

18. A method of cooling a data center according to claim 16, wherein the sensed conditions are temperature.

19. A method of cooling a data center according to claim 16, wherein the sensed conditions are pressure differential.

20. A method of cooling a data center according to claim 15, wherein:
each of the vertical IT racks of the at least some of the rows of the vertical IT racks has different vertical zones; and
the combination of the multiple air passageway zones and the grate panels results in the air passing through each of the multiple air passageway zones being directed at a different one of the different vertical zones.

\* \* \* \* \*